United States Patent
Musilli, Jr. et al.

(10) Patent No.: US 12,369,283 B2
(45) Date of Patent: *Jul. 22, 2025

(54) COOLING SYSTEMS AND METHODS FOR DATA CENTERS

(71) Applicant: Integra Mission Critical, LLC, Dallas, TX (US)

(72) Inventors: John A. Musilli, Jr., San Diego, CA (US); Thomas Neuman, Dallas, TX (US)

(73) Assignee: Integra Mission Critical, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/817,342

(22) Filed: Aug. 3, 2022

(65) Prior Publication Data

US 2023/0038890 A1    Feb. 9, 2023

Related U.S. Application Data

(60) Provisional application No. 63/229,470, filed on Aug. 4, 2021.

(51) Int. Cl.
*H05K 7/20*    (2006.01)
(52) U.S. Cl.
CPC ................................. *H05K 7/2079* (2013.01)
(58) Field of Classification Search
CPC ............. H05K 7/2079; H05K 7/20745; H05K 7/20836
See application file for complete search history.

(56) References Cited

U.S. PATENT DOCUMENTS 9,915,453 B2    3/2018  Moses
2004/0118137 A1    6/2004  Patel et al.
(Continued)

FOREIGN PATENT DOCUMENTS

CN    101487640 A    7/2009
CN    106464523 B  *  9/2019 ........... G02B 6/4452

OTHER PUBLICATIONS

International Search Report and Written Opinion issued Nov. 21, 2022 regarding International Application No. PCT/US2022/074557, 8 pages.

(Continued)

*Primary Examiner* — Emmanuel E Duke

(57) ABSTRACT

A system includes multiple MHACUs for cooling one or more servers in a data hall. The system also includes a pump package for providing cooling fluid to the MHACUs, and a fluid supply line conveying the cooling fluid to the MHACUs. The system also includes at least one computing device configured to: determine that a cooling fluid temperature in a first MHACU has risen to a first temperature that is less than a predetermined maximum temperature; in response to the determination, control the system to provide at least some of the cooling fluid to a second MHACU; determine that the cooling fluid temperature in the second MHACU has risen to a second temperature that is at least the predetermined maximum temperature; and in response to the determination, control the system to provide the cooling fluid to a fluid return line for return to the pump package.

20 Claims, 11 Drawing Sheets

(56) References Cited

U.S. PATENT DOCUMENTS

2010/0307716 A1* 12/2010 Bean, Jr. ............ H05K 7/20745
165/80.2
2011/0056674 A1     3/2011 Campbell et al.
2011/0239681 A1    10/2011 Ziegler
2014/0060798 A1     3/2014 Eckberg et al.

OTHER PUBLICATIONS

Vertiv Co., "Liebertr Xdo™ Overhead Cooling Module", SL-16665 (R06/09), 2016, 2 pages.
Vertiv Co., "Libert® Xtreme Density System Design Manual", SL-16655_REV16_12-23, Dec. 2023, 164 pages.
Extended European Search Report issued May 26, 2025 regarding Application No. 22854108.2, 10 pages.

* cited by examiner

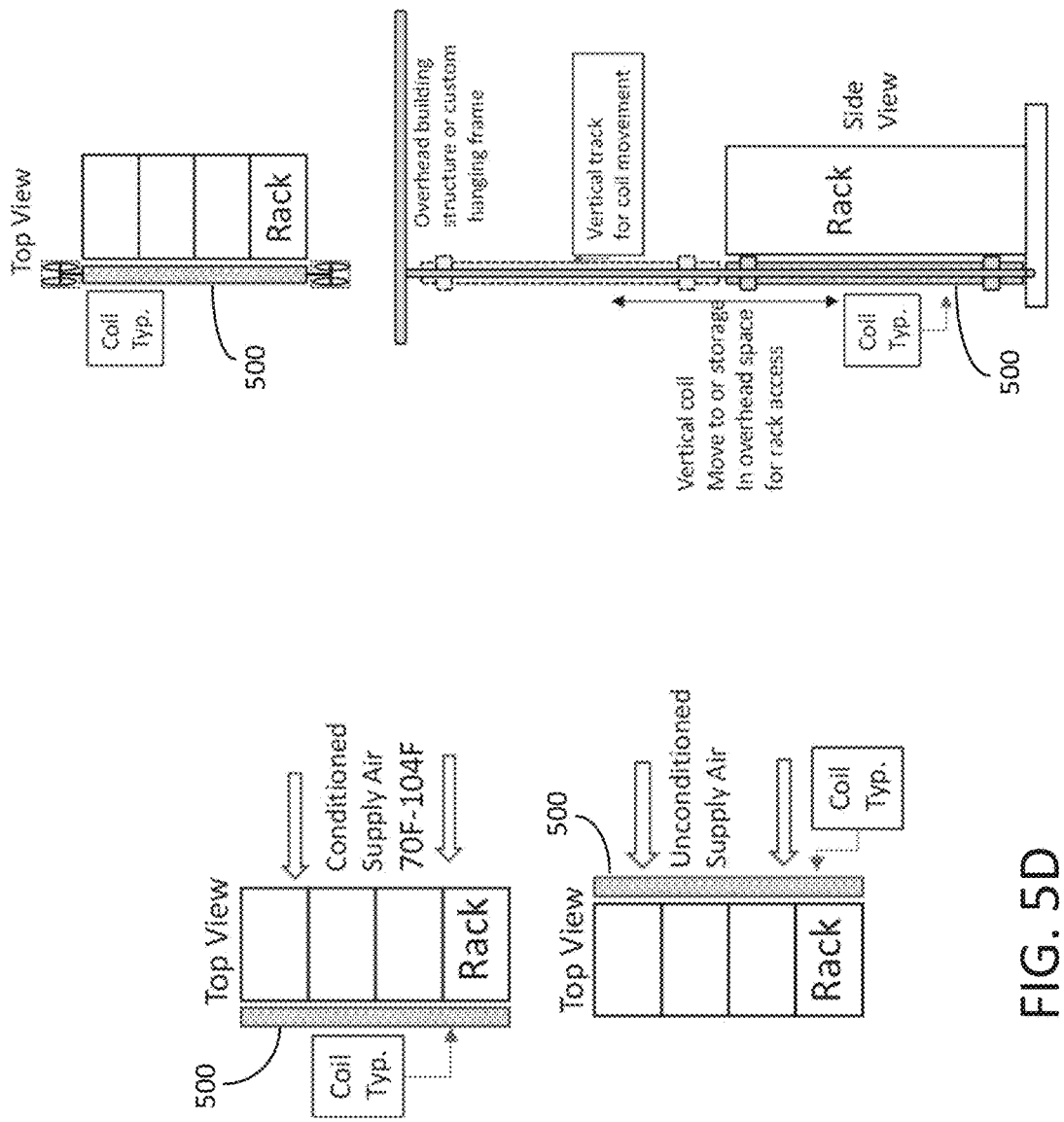

COOLING SYSTEMS AND METHODS FOR DATA CENTERS

CROSS-REFERENCE TO RELATED APPLICATIONS AND PRIORITY CLAIM

This application claims priority under 35 U.S.C. § 119(e) to U.S. Provisional Patent Application No. 63/229,470 filed on Aug. 4, 2021, which is hereby incorporated by reference in its entirety.

TECHNICAL FIELD

Embodiments of the present disclosure relate to cooling systems and, in particular, to cooling systems and methods for use in colocation data centers.

BACKGROUND

Colocation data centers typically require flexibility in space utilization to accommodate diverse customer requirements. For example, some colocation data centers must be equipped to provide space for both ASHRAE (American Society of Heating, Refrigerating, and Air-Conditioning Engineers) allowable and ASHRAE recommended customers. Many data center providers prefer closed systems, in which no direct outside air or liquid is supplied to the data hall for cooling.

SUMMARY

This disclosure provides cooling systems and methods for use in colocation data centers.

In a first embodiment, a system includes multiple modular hot aisle cooling units (MHACUs) arranged in a series in a data hall, each MHACU configured to cool one or more servers in the data hall. The system also includes a pump package configured to provide cooling fluid to the MHACUs. The system also includes a fluid supply line configured to convey the cooling fluid from the pump package to the multiple MHACUs. The system also includes at least one computing device configured to: determine that a temperature of the cooling fluid in a first MHACU among the multiple MHACUs has risen to a first temperature that is less than a predetermined maximum temperature; in response to the determination that the temperature of the cooling fluid in the first MHACU has risen to the first temperature, control the system to provide at least some of the cooling fluid to a second MHACU among the multiple MHACUs; determine that the temperature of the cooling fluid in the second MHACU has risen to a second temperature that is at least the predetermined maximum temperature; and in response to the determination that the temperature of the cooling fluid in the second MHACU has risen to the second temperature, control the system to provide the cooling fluid to a fluid return line for return to the pump package.

In a second embodiment, a method includes providing, via a fluid supply line, cooling fluid from a pump package to a first modular hot aisle cooling unit (MHACU) among multiple MHACUs arranged in a series in a data hall, each MHACU configured to cool one or more servers in the data hall. The method also includes determining that a temperature of the cooling fluid in the first MHACU has risen to a first temperature that is less than a predetermined maximum temperature. The method also includes, in response to the determining that the temperature of the cooling fluid in the first MHACU has risen to the first temperature, providing at least some of the cooling fluid to a second MHACU among the multiple MHACUs. The method also includes determining that the temperature of the cooling fluid in the second MHACU has risen to a second temperature that is at least the predetermined maximum temperature. The method also includes, in response to the determining that the temperature of the cooling fluid in the second MHACU has risen to the second temperature, providing the cooling fluid to a fluid return line for return to the pump package.

Other technical features may be readily apparent to one skilled in the art from the following figures, descriptions, and claims.

BRIEF DESCRIPTION OF THE DRAWINGS

FIGS. 5A through 5E illustrate example installations of cooling coils that can be used as one or more modular hot aisle cooling units (MHACUs) according to this disclosure;

DETAILED DESCRIPTION

Figure 1:
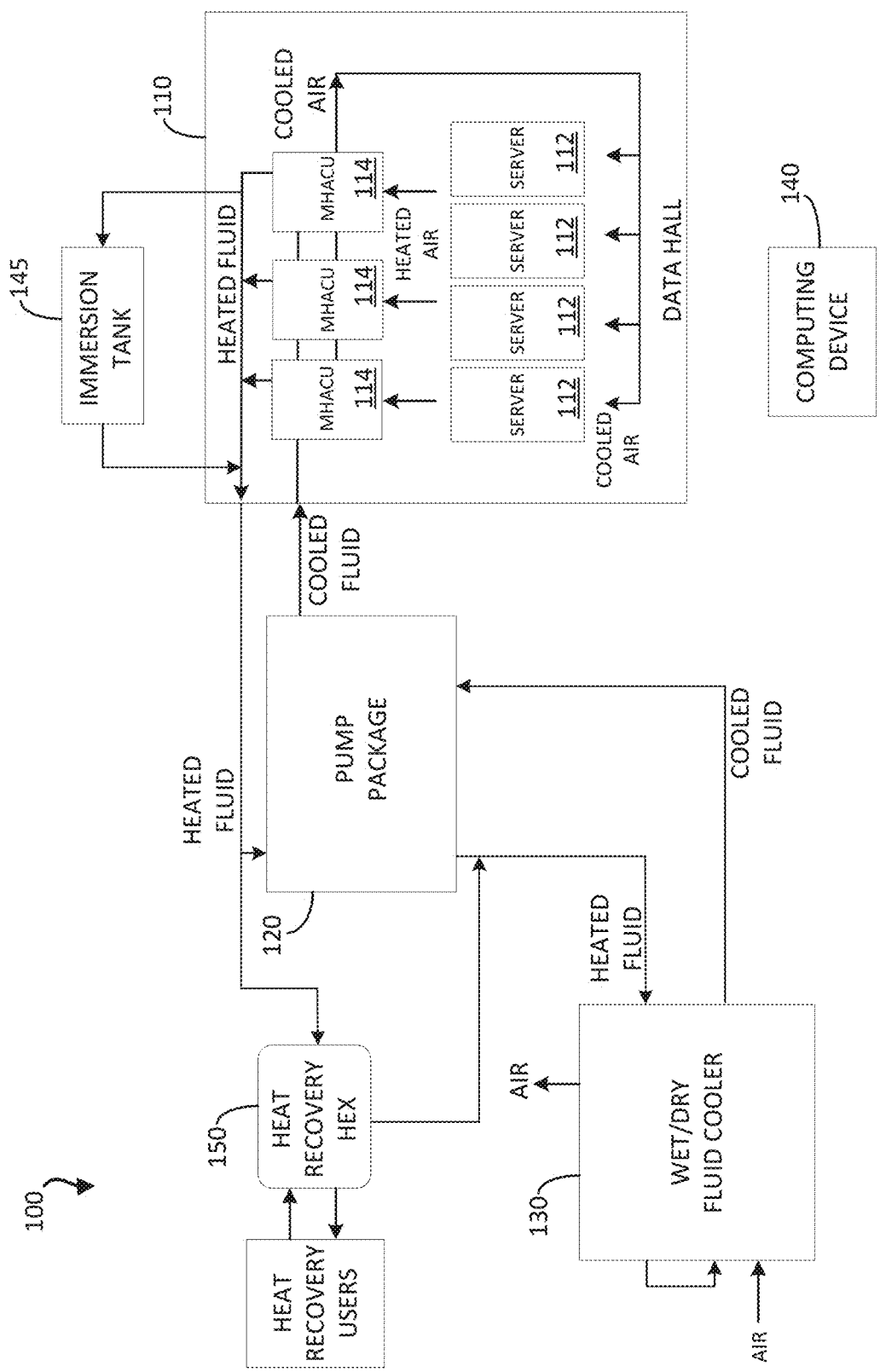
FIG. 1 illustrates an example cooling system for cooling a data center according to this disclosure.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

As discussed above, colocation data centers typically require flexibility in space utilization to accommodate diverse customer requirements. For example, some colocation data centers must be equipped to provide space for both ASHRAE allowable and ASHRAE recommended customers. Many data center providers prefer closed systems, in which no direct outside air or liquid is supplied to the data hall for cooling.

To address these and other issues, embodiments of the present disclosure provide indoor cooling systems for use with colocation data centers. The disclosed indoor cooling systems are designed to be operated at a wide range of fluid temperatures. The disclosed embodiments include cooling coils and immersion systems configured in different shapes and elevation to match the power and heat density of the prescribed supply air temperatures (SAT) for air cooling or entering fluid temperature (EFT) for liquid cooling, for computing device racks, computing device rows, computing device rooms, or computing device facility, in part or in whole. This system efficiency can be derived through the heat collection near the heat load, by removing the long air flow paths required in traditional colocation data center facilities from the compute device to the air handling equipment or the direct contact with a cooling fluid during immersion. The system efficiency can also be expressed in the amount of heat collected by way of the air to fluid transfer and/or fluid to fluid transfer through the custom configuration of cooling coils, location, sizes, shapes, and elevations. Additional efficiency can be found in the high Leaving Fluid Temperatures (LFTs) of the coils useable by fluid to fluid heat transfers performed within an immersion cooling system, and further efficiency through the higher quality heated fluid available to remote heat recover users or to remote heat rejection plant outside of the data hall.

FIG. 1 illustrates an example cooling system 100 for cooling a data center according to this disclosure. The embodiment of the cooling system 100 shown in FIG. 1 is for illustration only. Other embodiments of the cooling system 100 could be used without departing from the scope of this disclosure.

As shown in FIG. 1, the cooling system 100 includes a data hall 110, a pump package 120, a fluid cooler 130, and a computing device 140.

The data hall 110 represents at least a portion of a colocation data center and is an enclosed space that houses a plurality of servers 112 that are arranged in server racks. As known in the art, the servers 112 generate substantial amounts of thermal energy that tend to heat the space inside the data hall 110, thereby requiring cooling to maintain the temperature of the data hall 110 at a suitable level for proper operation of the servers 112 and for comfort of any personnel inside the data hall 110.

The data hall 110 includes an indoor cooling system comprising one or more modular hot aisle cooling units (MHACUs) 114. The MHACUs 114 are disposed above, behind, and/or in front of the servers 112 and are operable to cool the servers 112. In particular, each MHACU 114 can be mounted above, behind, and/or in front of the server racks in the data hall 110. The MHACUs 114 can be configured in different shapes and sizes and installed at different elevations and in different arrangements and combinations, to match the power and heat density of the prescribed supply air temperatures for computing device racks, computing device rows, computing device rooms, or computing device facility, in part or in whole.

The MHACUs 114 cool the servers 112 by receiving heated air (e.g., approximately 130° F.-140° F. for ASHRAE allowable or approximately 100° F. for ASHRAE recommended) rising from the servers 112, cooling the heated air into cooled air (e.g., approximately 95° F. for ASHRAE allowable or approximately 80° F. for ASHRAE recommended), and outputting the cooled air to cool the servers 112. In some embodiments, the amount of air volume delivered by the MHACUs 114 to the data hall 110 is dependent on the amount of power delivered to the data hall 110. For example, the MHACUs 114 may deliver at least 80 cubic feet/minute (CFM) of air at a temperature of 80° F. (or at least 108 CFM of air at a temperature of 95° F.) for each one kilowatt (1 kW) of power delivered to the data hall 110.

Each MHACU 114 is modular, and sits above, behind, and/or in front of one or more of the racks of servers 112. FIG. 1 shows three MHACUs 114, but there may be more or fewer depending on the embodiment. The number of MHACUs 114 is easily scaled for the application and depends on the load density of the servers 112, the cooling capacity of each MHACU 114, and the like. In some embodiments, each MHACU 114 is capable of providing approximately 150 kW-700 kW of cooling capacity, although other embodiments can provide other cooling capacities.

The MHACUs 114 improve system efficiency over traditional techniques by handling heat collection near the heat load. That is, the MHACUs 114 remove the long air flow paths required in traditional colocation data center facilities from the computing device to the air handling equipment. Overall system efficiency can also be addressed in the amount of heat collected by way of the air-to-fluid transfer through the custom configuration of cooling coils, location, sizes, shapes, and elevations. Additional efficiency can be found in the high Leaving Fluid Temperatures (LFTs) of the coils to a remote heat rejection plant outside of the data hall 110.

The MHACUs 114 are designed to be operated at a wide range of fluid temperatures. Each MHACU 114 can be individually controlled (including air throughput, leaving air temperature, leaving fluid temperature, and the like) in order to customize cooling levels in real time in different parts of the data hall 110. For example, if some of the servers 112 generate a greater load and require additional cooling, then one or more MHACUs 114 in the vicinity of those servers 112 can be controlled to increase cooling capacity.

In some embodiments, the MHACUs 114 are connected in series and are fluidly coupled to the pump package 120. This can be referred to as a "serial topology." In other embodiments, the MHACUs 114 can be connected in parallel. The connections to the MHACUs 114 can be formed individually, or in parallel or in series in any combination with each other or as a specific group, to produce the intended outcome, e.g., to collect the maximum amount of heat through an air-to-fluid transfer. Cooled fluid (e.g., approximately 90° F. for ASHRAE allowable or approximately 75° F. for ASHRAE recommended) received from the pump package 120 flows into each MHACU 114 and is used to cool the heated air from the servers 112. Once the fluid cools the heat air within the data hall 110, the heated fluid then returns to the pump package 120. In some embodiments, at least a portion of the heated fluid can be routed to one or more immersion tanks 145, as described in greater detail below. In some embodiments, the fluid is water, although other suitable fluids may be used and are within the scope of this disclosure.

In some embodiments, the system 100 also includes a heat recovery heat exchanger 150 for use in downstream heat recovery to support the needs of one or more heat recovery users. In some embodiments, the immersion tanks 145 can also generate higher quality heat suitable for downstream heat recovery. This high quality heat is available to the heat recovery heat exchanger 150 to support the needs of a heat recovery user.

Figure 2:
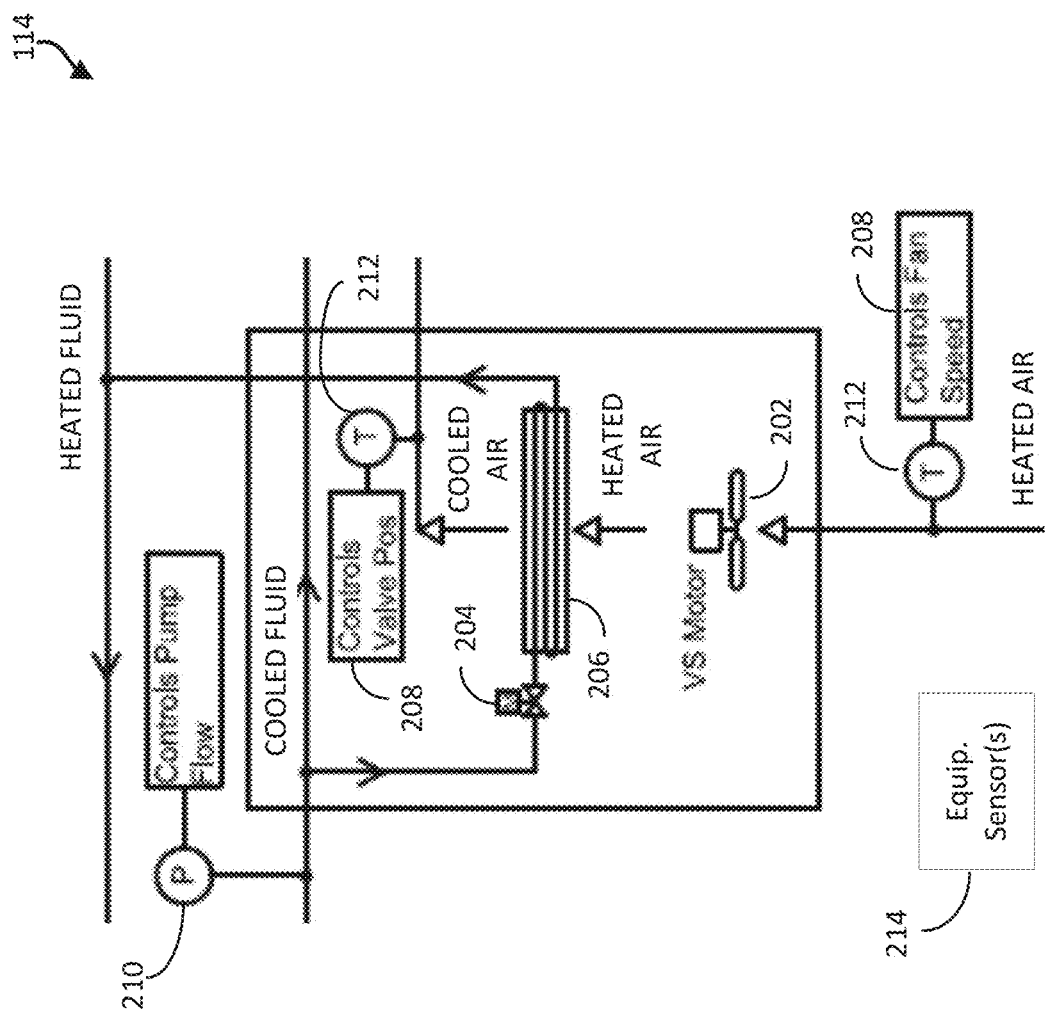
FIG. 2 illustrates further details of one example of a modular hot aisle cooling unit (MHACU) according to this disclosure.

FIG. 2 illustrates further details of one example of the MHACU 114 according to this disclosure. As shown in FIG. 2, the MHACU 114 includes one or more variable speed fans 202, one or more fluid valves 204, and at least one coil 206 for transferring thermal energy from the heated air to the cooled fluid. The MHACU 114 also includes at least one control system 208 for controlling operation and speed of the fan(s) 202 and the position of the valve(s) 204. The at least one control system 208 is communicatively coupled to one or more sensors, including one or more pressure sensors 210, thermometers or other temperature sensors 212, equipment sensors 214, fluid flow sensors (not shown), and the like. In some embodiments, the temperature sensors 212 can measure, e.g., air temperature in the supply and return aisle, air temperature in the entering and returning air stream, fluid temperature in the supply and return lines, fluid temperature into and out of the coil 206, and the like. Fluid flow sensors can include direct fluid contact sensors, pipe surface contact sensors, infrared sensors, and the like. The type and number of sensors can be customized to direct specific fluid flow, air flow, fluid pressure, air pressure, thermal content of a prescribed fluid, thermal content of a prescribed air volume, relative humidity, and the like. The pressure sensors 210 can measure pressure differential between the supply air and return air aisle, fluid pressure at the input and output to the coil 206, and the like. Other sensors can include one or more anemometers to measure air velocity within the air flow stream, or one or more ultrasonic fluid flow sensors.

The valve(s) 204 can include any suitable valve(s) in any suitable combination for controlling fluid flow in and around the MHACU 114. Examples of the valve(s) 204 can include (but are not limited to) two-way control valves, three-way control valves, four-way control valves, six-way control valves, balancing valves, actuator controlled valves, thermal controlled valves, flow controlled valves, pressure controlled valves, and compensating valves.

In some embodiments, each fan 202 can be dynamically controlled or set to a specific fixed value to maintain the proper air supply volume, air temperature, or static pressure differential between the hot return air aisle and the cold supply air aisle, either individually or in combination with one or more attributes supporting the computing devices. In general, data sent from the sensors to the control system 208 can be used, individually or in any combination, to improve data center power efficiency, cooling efficiency, or to reduce total water consumption through the real time response to individual rack, row, room, or site cooling load demand. For example, the computing device power can be matched with the cooling supply provided based on the actual heat load calculated from the power demand of the computing device(s). Cooling efficiency can be improved by cooling only the amount of heat generated by the computing devices. Total water consumption can be reduced by not over-pumping through the cooling towers or adiabatic cooling spray cooling solutions and sustaining water losses from drift and surface evaporation. The effective control of computing device entering air temperature (EAT) and the control of the coil leaving fluid temperature (LFT) is configured through sensor input and programmed calculations to match the precise cooling demand requirements of the immediate rack, row, room, or site.

In some embodiments, the equipment sensors 214 are remote sensors employed at or around computing equipment (e.g., the servers 112) in the data hall 110 to detect or measure properties or parameters of the computing equipment. For example, the equipment sensors 214 can include onboard power sensors embedded in computing devices, servers, or network equipment to measure power used by the computing equipment. As another example, the equipment sensors 214 can include onboard thermal sensors or fan speed sensors embedded in computing devices, servers, or network equipment to measure heat generated by the computing equipment or a current fan speed of the equipment. As yet another example, the equipment sensors 214 can include onboard sensors for measuring CPU or hash rate utilization of the servers 112. These measurements can be provided to the control system 208 to control cooling. In some embodiments, room level thermal sensors can be used to override the local coil controls to meet a global (overall data center space) thermal requirement. In some embodiments, room level static pressure sensors can be used to override the local coil controls to meet a global positive pressure requirement for the supply air aisles.

In some embodiments, measurements collected by the equipment sensors 214 can be used as thermal heat load proxies. Through the real time monitoring and collection of the power outputs and known locations as described below, thermal heat load values can be calculated for a discrete area such as a device, a rack, a row, a room, a building, or a site.

The following are examples of electrical power measurement that can be used as a proxy for thermal heat load:
Device level: Power strip with individual point of connection (POC) sensing output.
Rack level: Power sensors on local power strip(s) supporting the devices inside a single rack.
Rack level: Individual power metered or monitored busway electrical taps or circuit breakers directly supporting the specific rack.
Row level: Busway input power sensing meter or individual metering of electrical branch circuits supporting the row level power distribution.
Room level: Power sensor input from data center distribution panel(s), circuit breakers, metering sensors, or panel circuit board metering.
Building level: Power sensor input from data center electrical distribution boards and/or distribution circuit breakers supporting the data center device critical load.
Site level: Power sensor monitoring of the site level electrical sub-station output breakers to individual buildings where computing devices are supported.

In some embodiments, control can be facilitated using Data Center Infrastructure Management (DCIM) techniques. As known in the art, DCIM can be used to describe processes, procedures, control inputs, and control outputs for micro and macro management of computing devices or data center infrastructure power and cooling. DCIM techniques can take into account individual or collective inputs from computing devices, computing equipment rack level aggregation of power and or cooling demand, computing device power or cooling demand aggregated at the row level, device power or cooling demand aggregation at the room level, building level aggregation of device power or cooling demand, site level demand of device power and cooling, and the like.

Once the thermal energy is transferred from the air to the cooled fluid, thereby heating the fluid, the heated fluid (e.g., approximately 120° F. for ASHRAE allowable or approximately 90.3° F. for ASHRAE recommended) is output from each MHACU 114 back to the pump package 120 and delivered to the fluid cooler 130 to reject the heat stored in the fluid. The leaving fluid temperature (LFT) from the coil 206 can be controlled through the position of the valve 204 and/or the air volume developed by the speed of the fan 202 and the leaving air temperature from the coil 206. In some embodiments, the control system 208 (which can be part of or include the computing device 140) simultaneously controls the temperature of the cooled air (leaving the MHACU 114 and entering the cold aisle) and the temperature of the heated fluid (leaving the MHACU 114) by varying both fan air volume and cooling fluid flow rate.

Figure 3A:
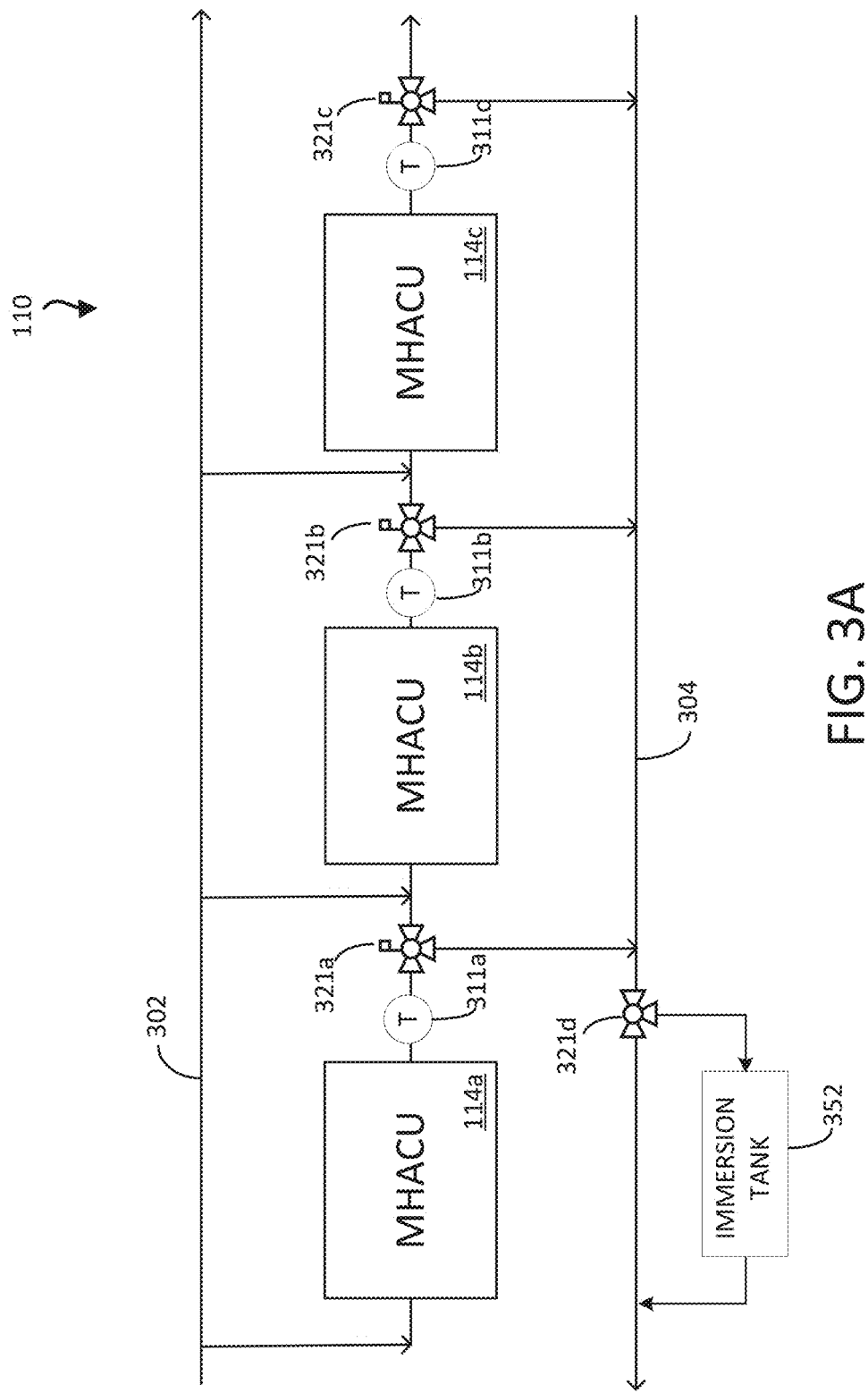
FIG. 3A illustrates details for improving the efficiency of heat rejection through increased thermal content of fluid, according to this disclosure.

FIG. 3A illustrates details for improving the efficiency of heat rejection through increased thermal content of fluid, according to this disclosure. Conventional industry practices are inefficient at increasing and/or returning relatively high fluid temperatures to heat rejecting systems, due to inconsistent heat rejecting compute workloads within the data center, thermal dilution of the thermal content of the cooled supply fluid (e.g., from the combining of different temperature fluid flows) to the heat rejection system, and/or low supply fluid temperatures due to mixed supply air temperatures prescribed by the end user or computing equipment manufacturers. In general, low supply fluid starting temperatures result in relatively low return fluid temperatures. For example, some conventional systems exhibit heated returned fluid at a temperature of approximately 60° F.-75° F. Significant heat transfer and power efficiencies gains can be realized when the heated fluid leaving a heat rejection system can be returned at the highest fluid temperature the system design can accept (e.g., approximately 120° F. in some air cooled systems). That is, the greater the difference in temperature (Delta T) between the cooled supply fluid and the heated return fluid, the more efficiency is gained for the heat rejection plant and equipment. The details shown in FIG. 3A provide at least one solution to these issues.

As shown in FIG. 3A, multiple MHACUs 114 (identified here at 114a-114c) are fluidly coupled together in the data hall 110. While FIG. 3A shows three MHACUs 114a-114c, there may be more or fewer depending on the embodiment. Fluid supplied to the MHACUs 114a-114c is received from the pump package 120 via a fluid supply line 302. Heated fluid to be returned to the pump package 120 is carried via a fluid return line 304. Each MHACU 114a-114c is associated with a temperature sensor 311a-311c and a fluid control valve 321a-321c.

Initially, some or all of the cooled supply fluid from the pump package 120 is input into the first MHACU 114a. The fluid moves through one or more coils 206 in the MHACU 114a, absorbing thermal energy from the air of the data hall 110. This causes a rise in temperature of the fluid (as measured by the temperature sensor 311a). If there is so much thermal energy absorbed by the MHACU 114a that the fluid temperature rises to a predetermined maximum (e.g., 120° F.), then the control valve 321a is controlled to return all the fluid to the fluid return line 304. Alternatively, if there is less thermal energy transfer, and the fluid temperature rises to a temperature (e.g., 75° F.) that is lower than the maximum, then the control valve 321a is controlled to provide at least some of the fluid to the second MHACU 114b.

In the second MHACU 114b, fluid moves through one or more coils 206, absorbing thermal energy from the air of the data hall 110. This causes a rise in temperature of the fluid (as measured by the temperature sensor 311b). If the MHACU 114b absorbs enough thermal energy to raise the fluid temperature to the maximum, then the control valve 321b is controlled to return all the fluid to the fluid return line 304. Alternatively, if there is less thermal energy transfer, and the fluid temperature rises to a lower temperature (e.g., 90° F.), then the control valve 321b is controlled to provide at least some of the fluid to the third MHACU 114c. This serial flow process continues until the maximum fluid temperature is reached or there are no more MHACUs in the series. In some embodiments, the fluid will return through the fluid return line 304 and enter or bypass one or more immersion tanks 352 according to the position of a control valve 321d, which can route some or all of the fluid through the immersion tank(s) 352 or bypass the immersion tank(s) 352 on the way to the pump package 120. The immersion tank(s) 352 can represent (or be represented by) the immersion tank 145 of FIG. 1.

The serial heating of the cooling fluid as shown in FIG. 3A can be enabled using input measurements of any or all sensors described above. The sensor inputs can be used with prescribed calculations, algorithms, and design protocols to control various components including the following:

Fluid flow rates at the individual coil, row, room, and/or site.
Fluid thermal release control point rates at the individual coil, row, room, and/or site.
Fan speeds at the individual coil, row, and/or room.
System or individual fluid pressure for the individual coil, row, and/or room.
System or individual air pressure settings at the row and/or room level.
Pump speed at the row, room, and/or site level.
Fluid mixing ratios at the coil, row, and/or room level.

In some embodiments, the serial heating of the cooling fluid as shown in FIG. 3A can directly support the entering fluid temperature (EFT) for, e.g., data center immersion cooling using the immersion tank(s) 352, data center direct rack liquid cooling, district heating, heat recovery to one or more heat recovery users using a heat recovery heat exchanger 150, and the like.

Figure 3B:
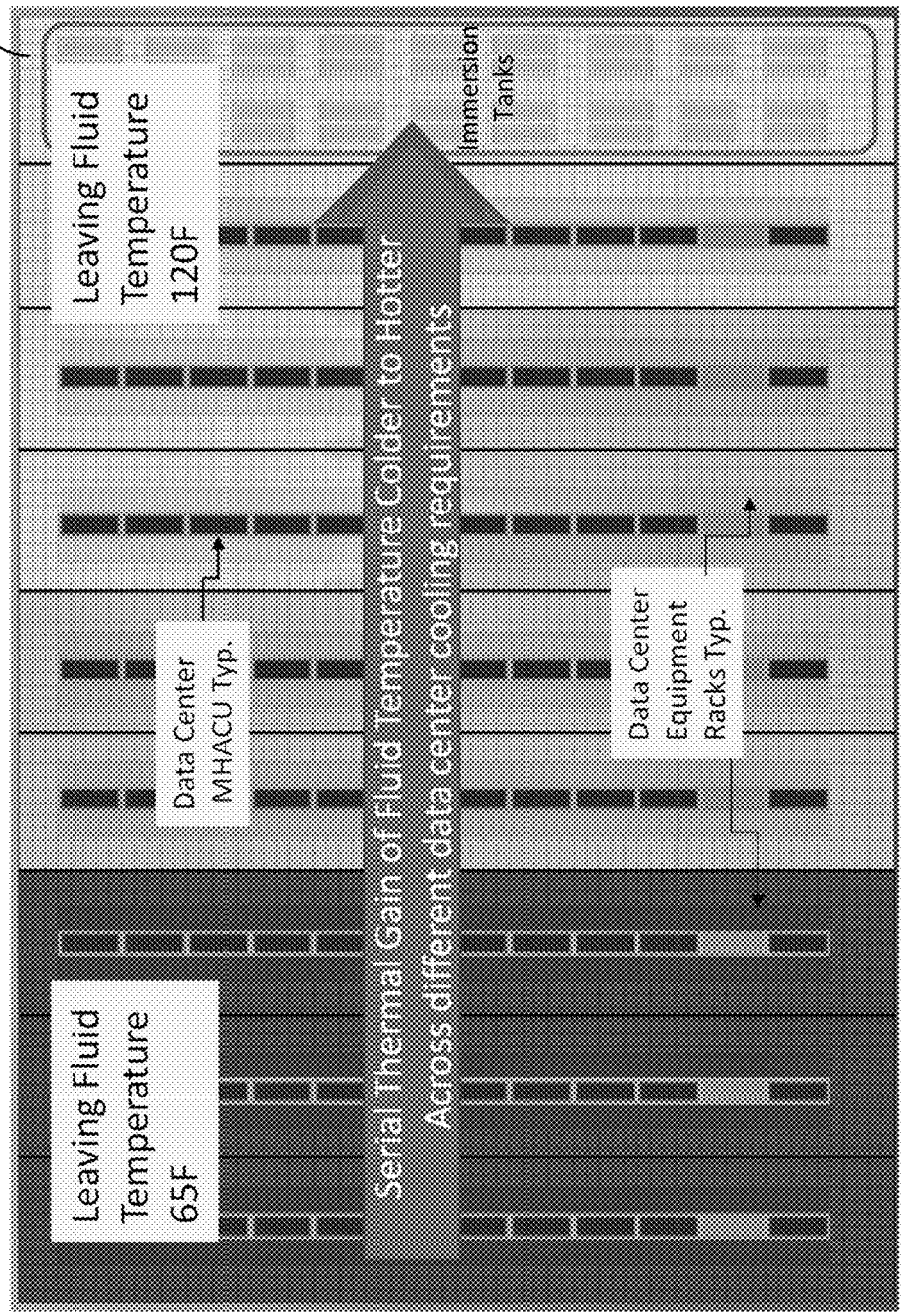
FIG. 3B illustrates a plan view of a data hall in which the efficiency improvement techniques of FIG. 3A are used, according to this disclosure.

FIG. 3B illustrates a plan view of a data hall 350 in which the efficiency improvement techniques of FIG. 3A are used, according to this disclosure. The data hall 350 can represent the data hall 110 of FIG. 1. As shown in FIG. 3B, there is a serial thermal gain in the fluid (i.e., the temperature of the fluid increases from colder to hotter) across the data hall 350. This corresponds to possible zones in the data hall 350 that may have different cooling requirements. In some embodiments, the data hall 350 includes one or more of the immersion tanks 352. The immersion tanks 352 can accept high entering fluid temperatures (EFT) greater than 120° F., generate leaving fluid temperatures (LFT) greater than 150° F., and may be, in whole or in part, a component of the fluid return line 304.

In some embodiments, one or more of the MHACUs 114 does not include any air filters. Instead, the MHACUs 114 can rely on a dedicated outdoor air system (DOAS) pressurization unit to clean the air.

Use of the MHACUs 114 in the data hall 110 provides a number of advantageous benefits over existing solutions. Because the MHACUs are mounted above and/or behind or in front of the server racks, little or no floor space is required. Also, no duct work is required in the floor, which alleviates the need for a raised floor. This reduces infrastructures costs. The MHACUs 114 use less energy than existing solutions, due to no duct work losses, no under-floor distribution losses, and no filter pressure losses. The MHACUs 114 provide a modular design that offers flexibility in rack and load density. Local control of each MHACU 114 helps to ensure cooled air at a uniform temperature to the server rack air inlets.

The fluid cooler 130 receives heated fluid from the MHACUs 114 in the data hall 110 via the pump package 120. The fluid cooler 130 cools the heated fluid using a multi-coil heat exchanger system, and outputs the cooled fluid to the pump package 120 for delivery to the MHACUs 114 in the data hall 110. The fluid cooler 130 can include, but is not limited to, any suitable heat rejection equipment or feature, such as an open loop evaporative cooling tower or surface water routed through a heat exchanger, to isolate data hall cooling systems from external contaminants, closed circuit cooling tower, closed loop adiabatic cooling, air cooled chillers, conventional chiller systems, and the like. While FIG. 1 shows the cooling system 100 with one fluid cooler 130, this is merely one example. In other embodiments, the cooling system 100 could include multiple fluid coolers 130, each with isolated flow. In further embodiments, the cooling system 100 could include multiple fluid coolers 130 with combined flow for redundancy. In still other embodiments, the cooling system 100 could include multiple fluid coolers 130 with combined flow for cooling multiple data halls 110, thus providing increased redundancy at a lower cost.

As discussed above, the cooling system 100 includes one or more computing devices 140 to control the operations of the cooling system 100. In some embodiments, each computing device 140 may be a service operated by a third party such as a person or a company. Each computing device 140 may be housed and operated at a location different than the location at which the rest of the cooling system 100 is located. That is to say, each computing device 140 is not bound to a specific location.

Figure 4A:
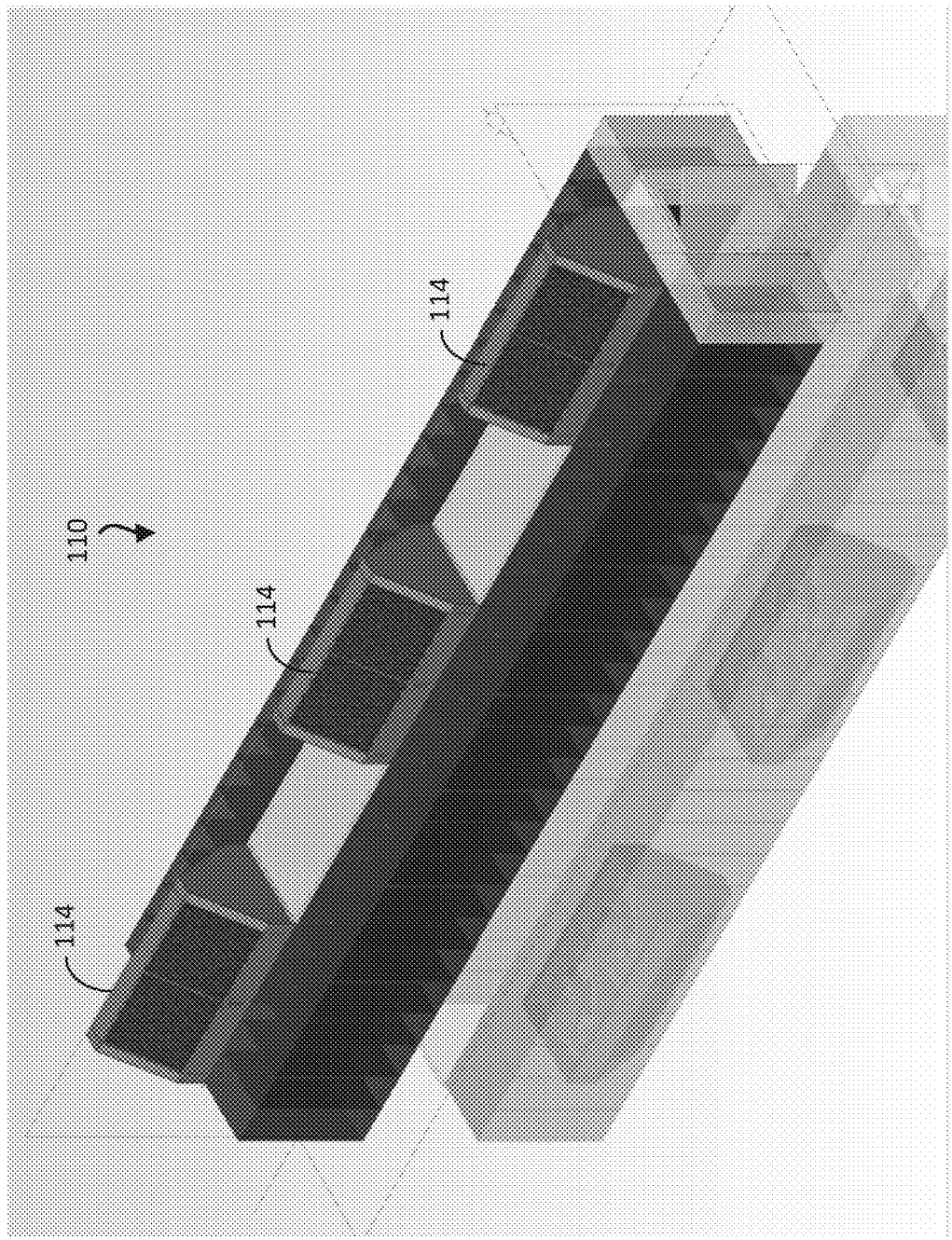
FIGS. 4A through 4C illustrate example data halls with different levels of cooling density according to this disclosure.
Figure 4B:
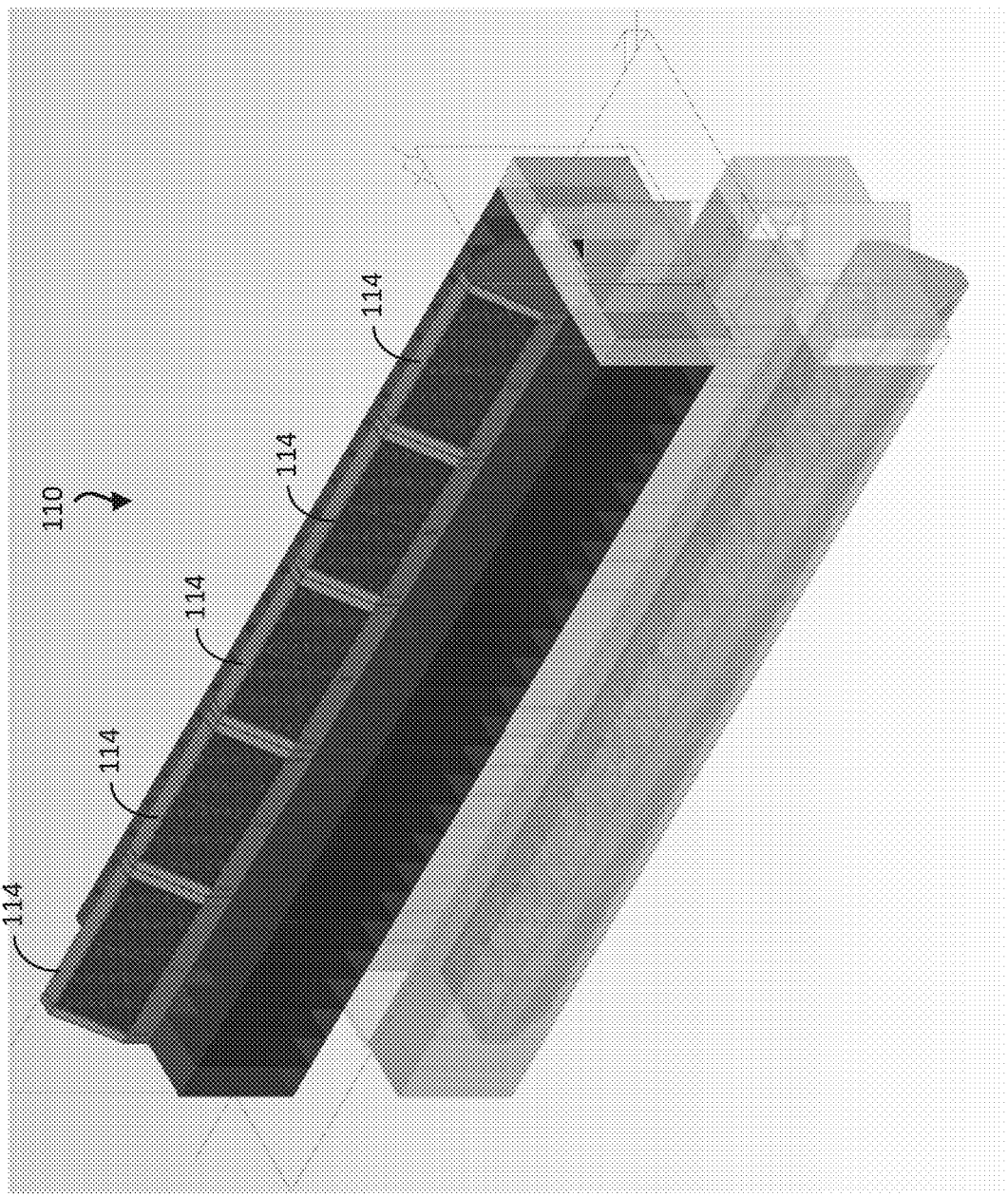
Figure 4C:
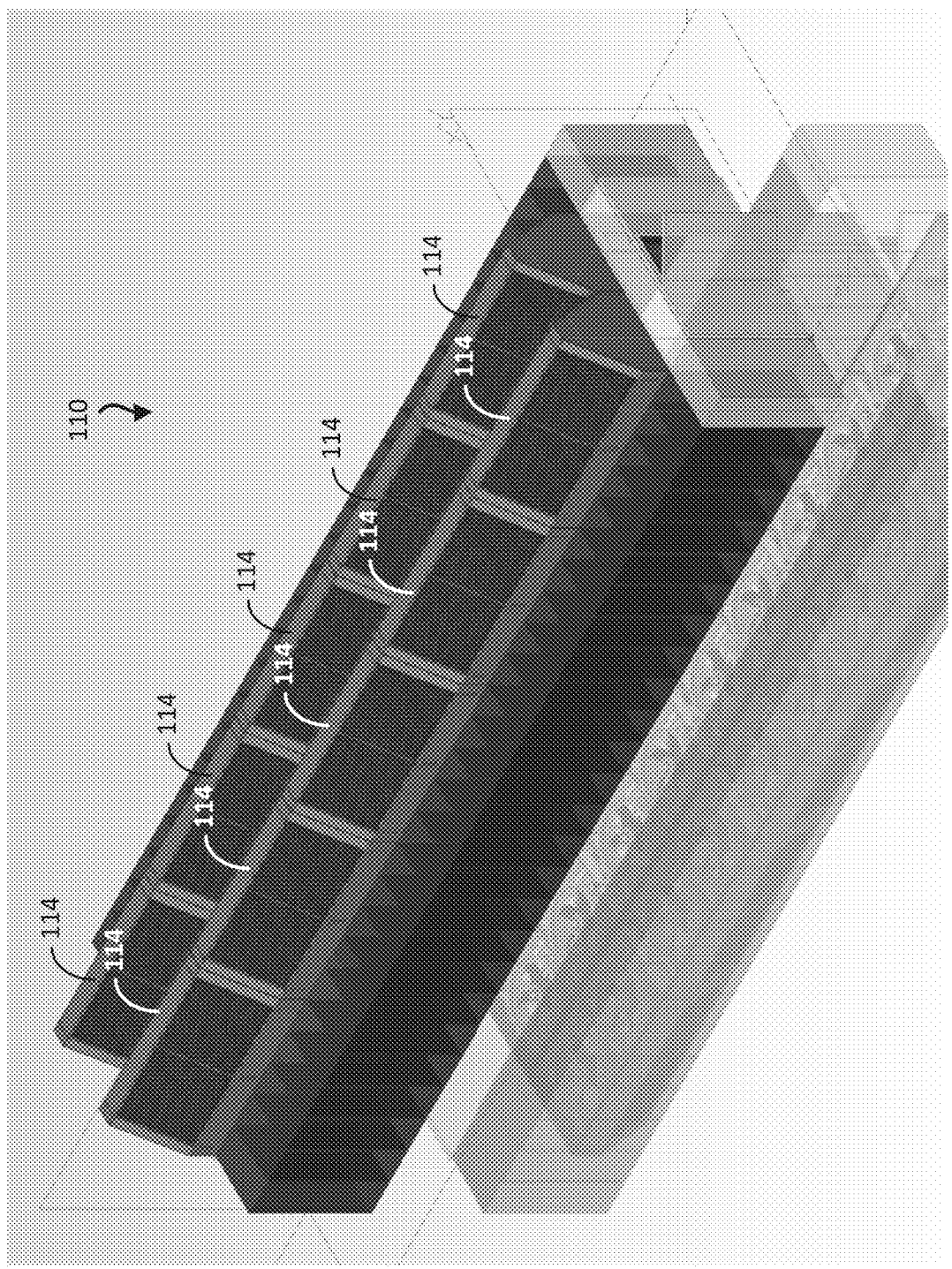

FIGS. 4A through 4C illustrate example data halls 110 with different levels of cooling density according to this disclosure. In particular, FIG. 4A illustrates a data hall 110 with low density cooling (e.g., approximately 3 kW-9 kW per rack), FIG. 4B illustrates a data hall 110 with medium density cooling (e.g., approximately 15 kW-20 kW per rack), and FIG. 4C illustrates a data hall 110 with high density cooling (e.g., approximately 30 kW-50 kW per rack). As shown in FIGS. 4A through 4C, the number of MHACUs 114 disposed above each data hall can be increased to provide greater cooling density. In FIGS. 4A through 4C, the MHACUs 114 are shown as having a shape similar to an upside-down 'V'. However, this is merely one example; in other embodiments, the MHACUs 114 could have any other suitable shape. For example, one or more of the MHACUs 114 could have a right-side-up 'V' shape, a 'TT' or 'W' shape (either right-side-up or upside-down), a cone shape (either concave or convex to grade), or a flat coil face that is parallel to grade, or a flat coil perpendicular to grade. An embodiment with a flat coil shape, where the coil is in a position perpendicular to grade and directly behind or in front of the data center equipment racks, is an efficient and effective way to collect significant heat through air to fluid transfer. Such a coil can be used independently or in combination with overhead coils.

As discussed above, the MHACUs 114 can be configured in different shapes and sizes and installed at different elevations and in different arrangements and combinations, to match the power and heat density of the prescribed supply air temperatures for computing device racks, computing device rows, computing device rooms, or computing device facility, in part or in whole. For example, the MHACUs 114 can be installed overhead parallel to the back of the rack in a single file arrangement down the center of hot aisle, in a dual path parallel to the back of the rack, perpendicular to the back of the rack and encroaching over the tops of the rack's footprint on each side of the aisle, or in any combination of these. In some embodiments, the MHACUs 114 may be mounted with a surface adjacent to the backs of the racks as a rolling or moveable panel configuration. In addition, the mounting frame(s) for mounting the MHACUs 114 can include any one or more of the following features: adjustable frame height, support frame supported by floor, support frame hinges, support frame rollers, support frame suspended from above to any suitable structure, frame with mounting tool bars, frame with plug-and-play lighting, frame with plug-and-play controls and sensors, coolant and power distribution frame mounts, coolant and power distribution plug-and-play connections, and frame and enclosure sealed at, for example, 2% or less air bypass at 0.33 inches of water column (wc).

Figure 5C:
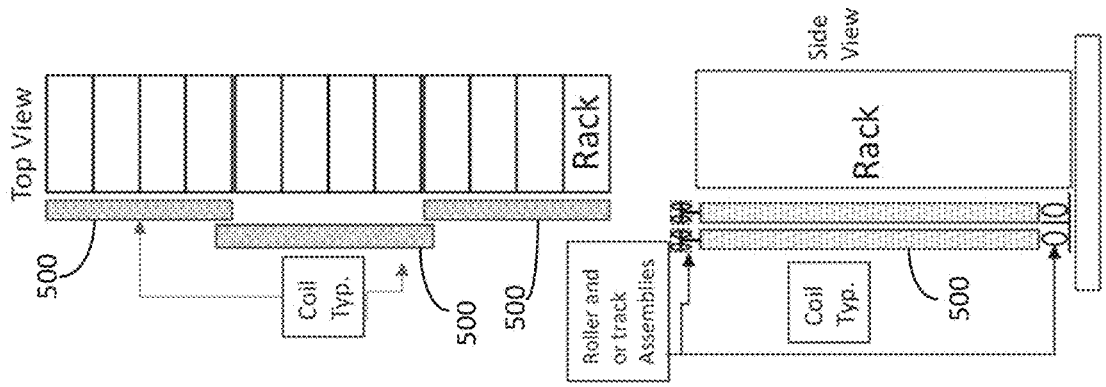
Figure 5B:
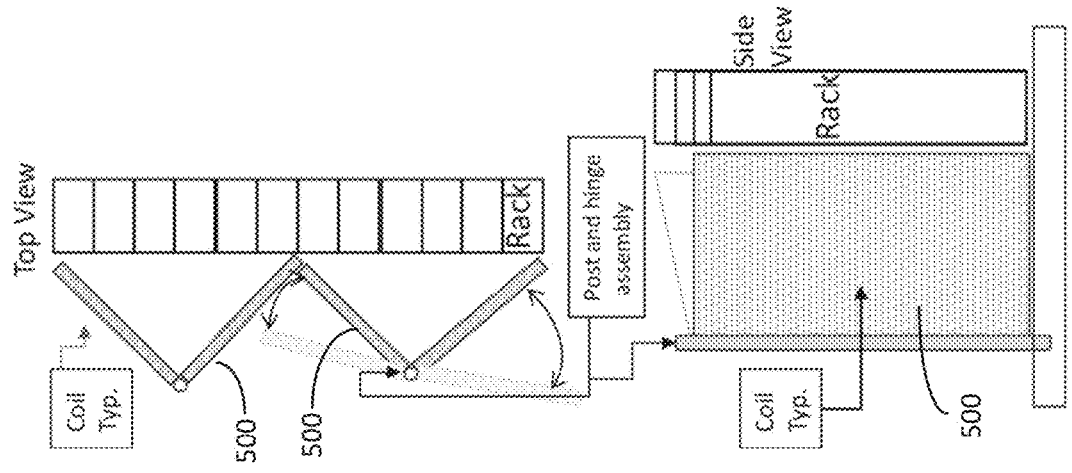
Figure 5A:
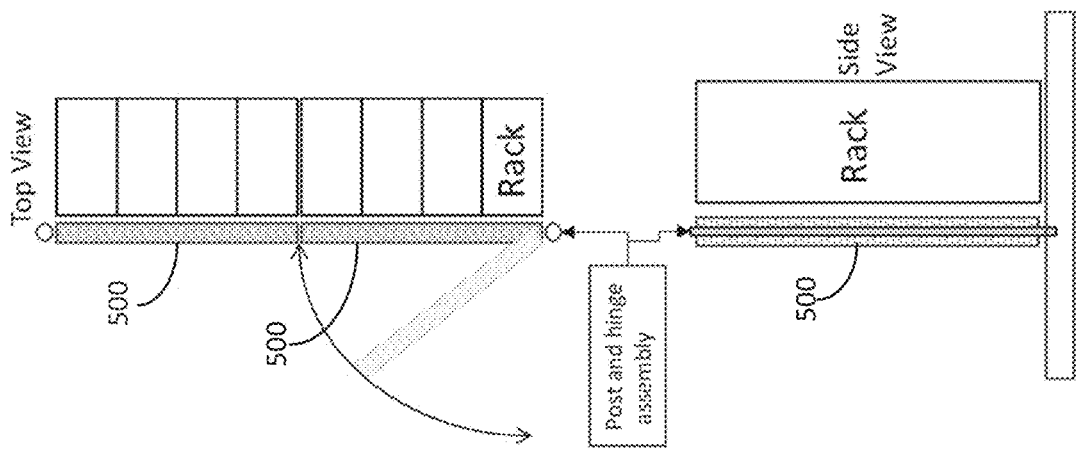

FIGS. 5A through 5E illustrate example installations of cooling coils 500 that can be used as the MHACUs 114 according to this disclosure. In particular, in the embodiments shown in FIGS. 5A through 5E, the coils 500 are disposed behind or in front of the equipment racks, instead of overhead. As shown in FIG. 5D, when the coils 500 are behind the equipment racks, the entering air is coming directly from the equipment being cooled. When the coils 500 are in front of the equipment racks, the entering air can be unconditioned and come from anywhere inside the room or space or from ambient air outside the room or building. The coils 500 can slide in a bypass arrangement (see, e.g., FIG. 5C), hinge or swing outward (see, e.g., FIG. 5A), or fold (e.g., bifold or accordion style) (see, e.g., FIG. 5B) behind the equipment racks. In some embodiments, the coils 500 can use the same supply fluid controls and return fluid features as the MHACUs 114.

In some embodiments, a coil 500 is greater than one data center equipment rack in width. In some embodiments, a coil 500 does not require support of any data center equipment racking but may contact the equipment racking if prescribed by design or user. In some embodiments, a coil 500 can be supported on a track and/or rollers in contact with the floor or flooring system. In some embodiments, a coil 500 can be suspended from overhead to the building structure. In some embodiments, a coil 500 can be supported by custom mounting frames or brackets supported overhead or from grade (see, e.g., FIG. 5E). This may be useful in areas that do not have much floor space.

For access to the equipment racks, a coil 500 can move or slide parallel to the equipment racks, swing similar to a door when mounted to hinges, or rise into the overhead ceiling or overhead space. In some embodiments, a coil 500 can be configured in a zig zag or overlapping for greater surface area exposed to the entering air.

To accommodate moving coils 500, the coil fluid line may be flexible or rigid, or may include a combination flex pipe with rigid pipe flex joints. In some embodiments, the cooling coil assembly may have fans and sensors connected to the coil 500 that will also have flexible connections and conductors that allow the coil 500 to be moved within a prescribed range to meet design requirements or user needs. In some embodiments, one or more of the fluid lines, electrical path, and sensor(s) can be designed to allow movement of a coil 500 to gain access to data center equipment.

In some embodiments, the coils 500 can be designed as passive coils, with no active external fan systems, and with all the air flows generated by the computing devices. In some embodiments, the coils 500 can be designed as active systems with fans 202 external to the computing devices at any location attached directly to the coil 500 or in proximity to the coil 500 and communicating through ducts or other enclosure or diverting system designed to channel air. The external fan system airflows can be constant of controlled variable speed and pressure.

Although FIGS. 1 through 5E illustrates example of a cooling system 100 and related details, various changes may be made to FIGS. 1 through 5E. For example, various components in the cooling system 100 may be combined, further subdivided, replicated, rearranged, or omitted and additional components may be added according to particular needs. As a particular example, in data centers with larger data halls 110, the cooling system 100 can include multiple fluid coolers 130, multiple MHACUs 114, and multiple pump packages 120 connected in parallel for common fluid connection of all components in the data hall 110. As another example, in some data halls, one or more computer room air handler (CRAH) units could be implemented in addition to, or lieu of, one or more of the MHACUs 114. In addition, while FIGS. 1 through 5E illustrate an example cooling system for use with data centers, the described functionality may be used in any other suitable device or system.

Figure 6:
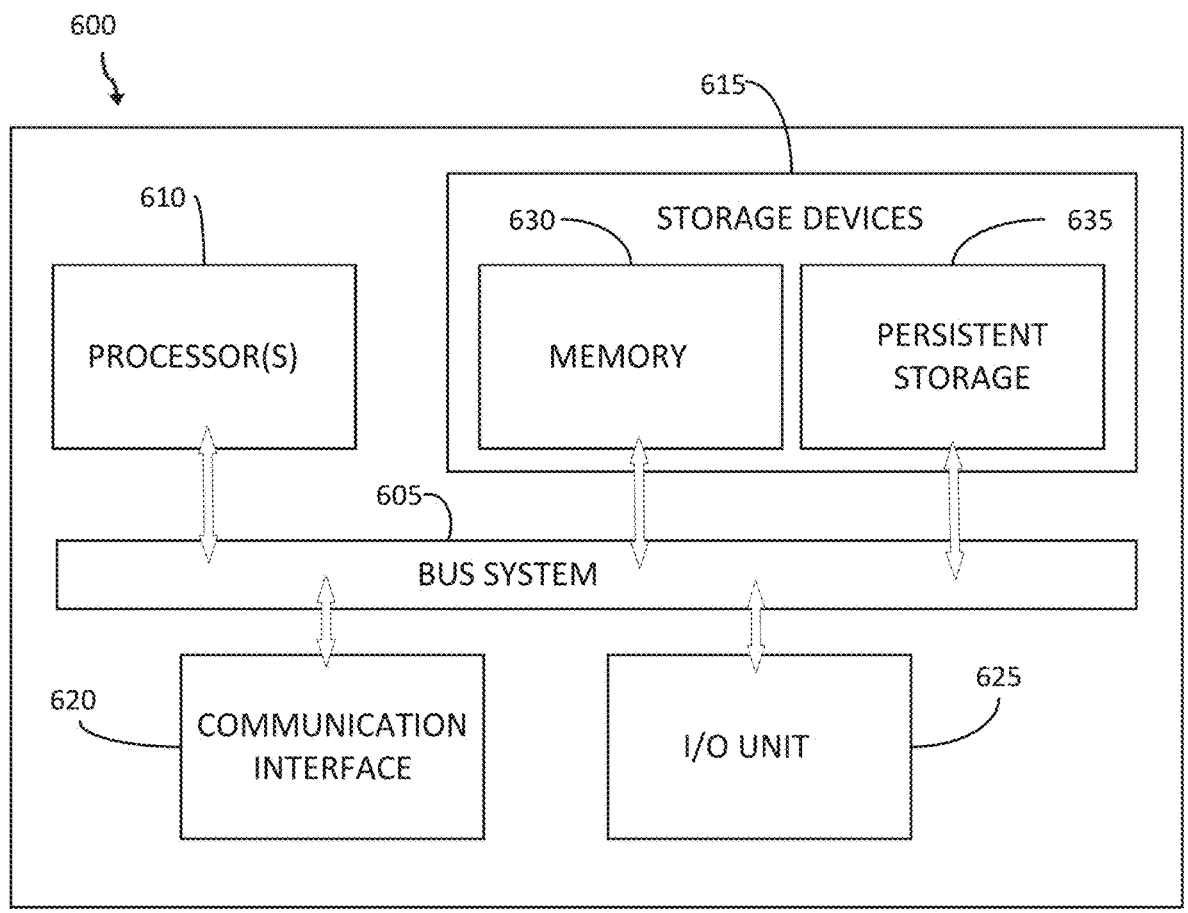
FIG. 6 illustrates an example of a computing device for use in a cooling system according to this disclosure.

FIG. 6 illustrates an example of a computing device 600 for use in a cooling system according to this disclosure. The computing device 600 may be the computing device 140 discussed above in FIG. 1. The computing device 600 can be configured to control operations in various components in the system 100. For example, the computing device 600 may control or monitor operations associated with the MHACU 114, the pump package 120, or the fluid cooler 130.

As shown in FIG. 6, the computing device 600 includes a bus system 605, which supports communication between processor(s) 610, storage devices 615, communication interface (or circuit) 620, and input/output (I/O) unit 625. The processor(s) 610 executes instructions that may be loaded into a memory 630. The processor(s) 610 may include any suitable number(s) and type(s) of processors or other devices in any suitable arrangement. Example types of processor(s) 610 include microprocessors, microcontrollers, digital signal processors, field programmable gate arrays, application specific integrated circuits, and discrete circuitry.

The memory 630 and a persistent storage 635 are examples of storage devices 615, which represent any structure(s) capable of storing and facilitating retrieval of information (such as data, program code, and/or other suitable information on a temporary or permanent basis). The memory 630 may represent a random access memory or any other suitable volatile or non-volatile storage device(s). The persistent storage 635 may contain one or more components or devices supporting longer-term storage of data, such as a read-only memory, hard drive, Flash memory, or optical disc. For example, persistent storage 635 may store one or more databases of data, standards data, results, data, client applications, etc.

The communication interface 620 supports communications with other systems or devices. For example, the communication interface 620 could include a network interface card or a wireless transceiver facilitating communications over the system 100. The communication interface 620 may support communications through any suitable physical or wireless communication link(s). The I/O unit 625 allows for input and output of data. For example, the I/O unit 625 may provide a connection for user input through a keyboard, mouse, keypad, touchscreen, or other suitable input devices. The I/O unit 625 may also send output to a display, printer, or other suitable output devices.

Although FIG. 6 illustrates one example of a computing device 600, various changes may be made to FIG. 6. For example, various components in FIG. 6 could be combined, further subdivided, or omitted and additional components could be added according to particular needs. As a particular example, while depicted as one system, the computing device 600 may include multiple computing systems that may be remotely located. In another example, different computing systems may provide some or all of the processing, storage, and/or communication resources according to this disclosure.

Figure 7:
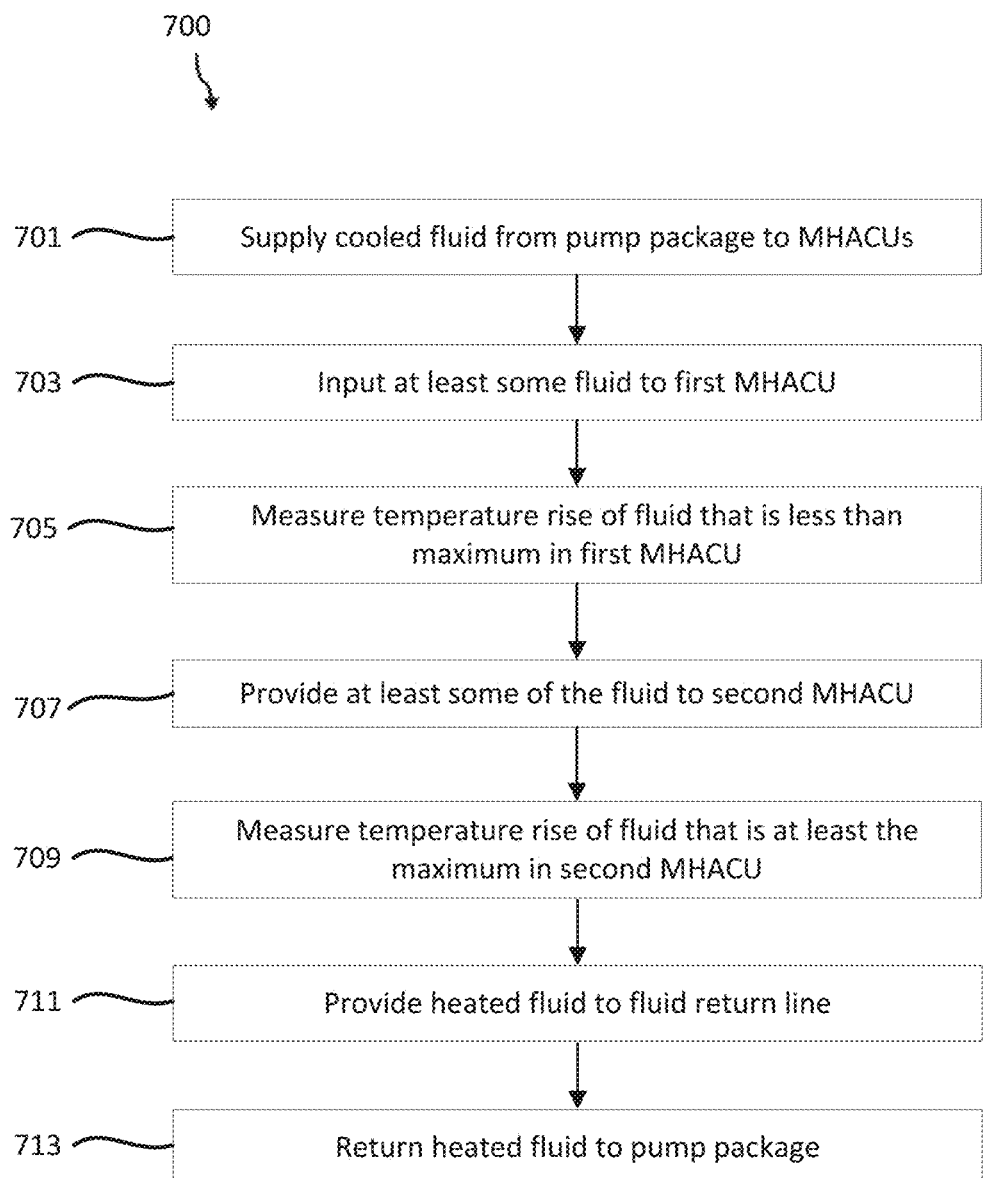
FIG. 7 is a flowchart illustrating an example of a cooling process using the cooling system of FIG. 1 according to this disclosure.

FIG. 7 is a flowchart illustrating an example of a cooling process 700 using the cooling system 100 of FIG. 1 according to various embodiments of the present disclosure. The embodiment of the cooling process 700 shown in FIG. 7 is for illustration only. Other embodiments of the cooling process 700 could be used without departing from the scope of this disclosure.

Referring to FIG. 7, in operation 701, cooled supply fluid from the pump package 120 is supplied to the MHACUs 114a-114c via a fluid supply line 302. In operation 703, some or all of the cooled supply fluid from the pump package 120 is input into the MHACU 114a, which is the first MHACU in the series. The fluid moves through one or more coils 206 in the MHACU 114a, absorbing thermal energy from the air of the data hall 110. In operation 705, the temperature sensor 311a measures that the fluid temperature in the MHACU 114a rises to a temperature that is less than a predetermined maximum. In operation 707, in response to the measured temperature, the control valve 321a is controlled to provide at least some of the fluid to the second MHACU 114b. The fluid moves through one or more coils 206 in the MHACU 114b, absorbing thermal energy from the air of the data hall 110. In operation 709, the temperature sensor 311b measures that the fluid temperature in the MHACU 114b rises to a temperature that is at least the predetermined maximum. In operation 711, in response to the measured temperature, the control valve 321b is controlled to provide the fluid to the fluid return line 304. In operation 713, the heated fluid is returned to the pump package 120 via the fluid return line 304.

The process 700 discussed above illustrates example operations that can be implemented in accordance with the principles of the present disclosure, and various changes could be made to the process 700. For example, while shown as a series of steps, various steps in the process 700 could overlap, occur in parallel, occur in a different order, or occur multiple times. In another example, steps may be omitted or replaced by other steps.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:
multiple modular hot aisle cooling units (MHACUs) arranged in a series in a data hall, each MHACU configured to cool one or more servers in the data hall;
a pump package configured to provide cooling fluid to the multiple MHACUs;
a fluid supply line configured to convey the cooling fluid from the pump package to the multiple MHACUs; and
at least one computing device configured to:
determine that a temperature of the cooling fluid in a first MHACU among the multiple MHACUs has risen to a first temperature that is less than a predetermined maximum temperature;
in response to the determination that the temperature of the cooling fluid in the first MHACU has risen to the first temperature, control the system to provide at least some of the cooling fluid to a second MHACU among the multiple MHACUs;
determine that the temperature of the cooling fluid in the second MHACU has risen to a second temperature that is at least the predetermined maximum temperature; and
in response to the determination that the temperature of the cooling fluid in the second MHACU has risen to the second temperature, control the system to provide the cooling fluid to a fluid return line for return to the pump package.

2. The system of claim 1, further comprising:
a first temperature sensor configured to measure the temperature of the cooling fluid in the first MHACU; and
a second temperature sensor configured to measure the temperature of the cooling fluid in the second MHACU.

3. The system of claim 1, further comprising:
at least one coil disposed in the first MHACU, the at least one coil configured to transfer thermal energy from heated air to the cooling fluid while the cooling fluid is conveyed through the at least one coil and the heated air passes over the at least one coil.

4. The system of claim 3, wherein the heated air is heated by the one or more servers and flows from the one or more servers to the first MHACU.

5. The system of claim 1, wherein each of the multiple MHACUs is disposed above, behind, or in front of the one or more servers.

6. The system of claim 1, wherein the at least one computing device is further configured to independently control at least one of air throughput, leaving air temperature, or leaving fluid temperature in each of the multiple MHACUs to customize cooling levels in different parts of the data hall.

7. The system of claim 6, wherein the at least one computing device is further configured to:
calculate heat loads based on power demands of the one or more servers; and
use the calculated heat loads to determine the customized cooling levels in different parts of the data halls.

8. The system of claim 1, wherein the return fluid line comprises at least one immersion tank fluidly coupled between the multiple MHACUs and the pump package.

9. The system of claim 1, further comprising:
one or more equipment sensors disposed adjacent to or within at least one of the one or more servers and communicatively coupled to the at least one computing device, the one or more equipment sensors configured to measure one or more properties of the servers, the one or more equipment sensors comprising at least one of: a power sensor, a thermal sensor, a fan speed sensor, or a CPU sensor.

10. The system of claim 1, further comprising:
a fluid cooler configured to receive heated fluid from the multiple MHACUs via the pump package, cool the heated fluid to form the cooling fluid, and output the cooling fluid to the pump package.

11. A method comprising:
providing, via a fluid supply line, cooling fluid from a pump package to a first modular hot aisle cooling unit (MHACU) among multiple MHACUs arranged in a series in a data hall, each MHACU configured to cool one or more servers in the data hall;
determining that a temperature of the cooling fluid in the first MHACU has risen to a first temperature that is less than a predetermined maximum temperature;
in response to the determining that the temperature of the cooling fluid in the first MHACU has risen to the first temperature, providing at least some of the cooling fluid to a second MHACU among the multiple MHACUs;
determining that the temperature of the cooling fluid in the second MHACU has risen to a second temperature that is at least the predetermined maximum temperature; and
in response to the determining that the temperature of the cooling fluid in the second MHACU has risen to the second temperature, providing the cooling fluid to a fluid return line for return to the pump package.

12. The method of claim 11, further comprising:
measuring the temperature of the cooling fluid in the first MHACU using a first temperature sensor; and
measuring the temperature of the cooling fluid in the second MHACU using a second temperature sensor.

13. The method of claim 11, further comprising:
transferring thermal energy from heated air to the cooling fluid, using at least one coil disposed in the first MHACU, while the cooling fluid is conveyed through the at least one coil and the heated air passes over the at least one coil.

14. The method of claim 13, wherein the heated air is heated by the one or more servers and flows from the one or more servers to the first MHACU.

15. The method of claim 11, wherein each of the multiple MHACUs is disposed above, behind, or in front of the one or more servers.

16. The method of claim 11, further comprising:
independently controlling at least one of air throughput, leaving air temperature, or leaving fluid temperature in each of the multiple MHACUs to customize cooling levels in different parts of the data hall.

17. The method of claim 16, further comprising:
calculating heat loads based on power demands of the one or more servers; and
using the calculated heat loads to determine the customized cooling levels in different parts of the data halls.

18. The method of claim 11, wherein the return fluid line comprises at least one immersion tank fluidly coupled between the multiple MHACUs and the pump package.

19. The method of claim 11, further comprising:
measuring one or more properties of the servers using one or more equipment sensors disposed adjacent to or within at least one of the one or more servers, the one or more equipment sensors communicatively coupled to the at least one computing device, the one or more equipment sensors comprising at least one of: a power sensor, a thermal sensor, a fan speed sensor, or a CPU sensor.

20. The method of claim 11, further comprising:
receiving, at a fluid cooler, heated fluid from the multiple MHACUs via the pump package;
cooling the heated fluid to form the cooling fluid; and
output the cooling fluid to the pump package.

* * * * *

UNITED STATES PATENT AND TRADEMARK OFFICE
CERTIFICATE OF CORRECTION

| | | |
|---|---|---|
| PATENT NO. | : 12,369,283 B2 | Page 1 of 1 |
| APPLICATION NO. | : 17/817342 | |
| DATED | : July 22, 2025 | |
| INVENTOR(S) | : Musilli, Jr. et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 188 days.

Signed and Sealed this
Twenty-fifth Day of November, 2025

John A. Squires
*Director of the United States Patent and Trademark Office*